US011756806B2

(12) United States Patent
Kitagawa et al.

(10) Patent No.: US 11,756,806 B2
(45) Date of Patent: Sep. 12, 2023

(54) HEATER POWER FEEDING MECHANISM

(71) Applicant: Tokyo Electron Limited, Tokyo (JP)

(72) Inventors: Dai Kitagawa, Miyagi (JP); Katsuyuki Koizumi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 86 days.

(21) Appl. No.: 17/399,055

(22) Filed: Aug. 11, 2021

(65) Prior Publication Data

US 2021/0366741 A1    Nov. 25, 2021

Related U.S. Application Data

(63) Continuation of application No. 15/300,349, filed as application No. PCT/JP2015/063286 on May 8, 2015, now abandoned.

(30) Foreign Application Priority Data

May 19, 2014  (JP) ................................. 2014-103511

(51) Int. Cl.
| | | |
|---|---|---|
| H01L 21/67 | (2006.01) | |
| H01L 21/683 | (2006.01) | |
| H05B 1/02 | (2006.01) | |
| H05B 3/28 | (2006.01) | |

(52) U.S. Cl.
CPC .. *H01L 21/67103* (2013.01); *H01L 21/67069* (2013.01); *H01L 21/67248* (2013.01); *H01L 21/6831* (2013.01); *H05B 1/0233* (2013.01); *H05B 3/283* (2013.01)

(58) Field of Classification Search
CPC ... H05B 1/0233; H05B 3/283; H01L 21/6831; H01L 21/67069; H01L 21/67248; H01L 21/67103
USPC ......................................................... 219/477
See application file for complete search history.

(56) References Cited

U.S. PATENT DOCUMENTS

| | | | |
|---|---|---|---|
| 1,348,648 A | 8/1920 | Kelly | |
| 1,417,154 A | 5/1922 | Finizio | |
| 1,534,673 A | 4/1925 | Weir | |
| 2,494,447 A * | 1/1950 | Mosthaf | ................. H05B 3/748 |
| | | | 219/460.1 |

(Continued)

FOREIGN PATENT DOCUMENTS

| | | |
|---|---|---|
| JP | 2001-057370 A | 2/2001 |
| JP | 2003-146770 A | 5/2003 |

(Continued)

OTHER PUBLICATIONS

Korean Office Action dated Jun. 10, 2021, in corresponding Korean Patent Application No. 10-2016-7029093.

*Primary Examiner* — Eric S Stapleton
(74) *Attorney, Agent, or Firm* — XSENSUS LLP

(57) ABSTRACT

A heater power feeding mechanism for independently controlling temperatures of zones of a stage on which a substrate is placed. The respective zones of the stage include heaters. The heater power feeding mechanism includes a plurality of heater terminals configured to be connected to the heaters, a plurality of heater wires connected to the heater terminals, and an offset structure that offsets the heater wires from each other. The heater terminals are disposed on the periphery of a holding plate for holding the stage.

16 Claims, 4 Drawing Sheets

(56) References Cited

U.S. PATENT DOCUMENTS

| | | | | |
|---|---|---|---|---|
| 3,500,018 A * | 3/1970 | Stiller | H05B 3/76 | 219/463.1 |
| 3,740,513 A * | 6/1973 | Peters, Jr. | A47B 77/08 | 219/622 |
| 4,467,162 A * | 8/1984 | Kondo | H05B 6/1209 | 219/622 |
| 4,511,789 A * | 4/1985 | Goessler | H05B 3/746 | 219/486 |
| 4,538,051 A * | 8/1985 | Schreder | H05B 3/748 | 219/457.1 |
| 4,629,843 A * | 12/1986 | Kato | H05B 6/1254 | 219/676 |
| 4,713,527 A * | 12/1987 | Kicherer | H05B 3/748 | 219/544 |
| 4,931,621 A * | 6/1990 | Goessler | H05B 3/748 | 219/448.19 |
| 4,961,798 A * | 10/1990 | Hart | F16L 58/181 | 156/499 |
| 5,122,639 A * | 6/1992 | Kicherer | H05B 3/70 | 219/541 |
| 5,153,413 A * | 10/1992 | Wilde | H05B 3/748 | 219/458.1 |
| 5,280,156 A * | 1/1994 | Niori | H01L 21/67103 | 219/385 |
| 5,306,895 A * | 4/1994 | Ushikoshi | C23C 16/4586 | 392/416 |
| 5,347,610 A * | 9/1994 | Lee | F24H 9/2028 | 219/508 |
| 5,498,853 A * | 3/1996 | Gross | H05B 3/748 | 219/461.1 |
| 5,550,354 A * | 8/1996 | Kimura | H05B 6/362 | 219/673 |
| 5,603,858 A * | 2/1997 | Wyatt | A47J 39/006 | 126/246 |
| 5,616,024 A * | 4/1997 | Nobori | C23C 16/46 | 432/5 |
| 5,676,758 A * | 10/1997 | Hasegawa | C23C 16/45568 | 118/723 ER |
| 5,728,635 A * | 3/1998 | Kobayashi | C04B 35/581 | 501/153 |
| 5,796,075 A * | 8/1998 | Gross | H05B 3/748 | 219/461.1 |
| 5,800,618 A * | 9/1998 | Niori | H01J 37/32009 | 118/725 |
| 5,886,864 A * | 3/1999 | Dvorsky | H01L 21/68742 | 279/128 |
| 5,892,205 A * | 4/1999 | Wilde | H05B 3/748 | 219/461.1 |
| 5,893,996 A * | 4/1999 | Gross | H05B 3/746 | 219/460.1 |
| 5,946,183 A * | 8/1999 | Yamada | H01L 21/6833 | 279/128 |
| 5,954,984 A * | 9/1999 | Ablah | A47G 23/04 | 126/246 |
| 5,998,320 A * | 12/1999 | Yamada | C04B 35/581 | 501/153 |
| 6,028,022 A * | 2/2000 | Ohashi | C04B 37/005 | 501/153 |
| 6,036,878 A * | 3/2000 | Collins | H01J 37/32458 | 216/68 |
| 6,038,760 A * | 3/2000 | Antoine | H05B 6/1245 | 219/676 |
| 6,133,557 A * | 10/2000 | Kawanabe | H05B 3/30 | 501/153 |
| 6,204,489 B1 * | 3/2001 | Katsuda | H05B 3/283 | 219/544 |
| 6,239,402 B1 * | 5/2001 | Araki | H01L 23/15 | 118/725 |
| 6,261,708 B1 * | 7/2001 | Ohashi | C04B 35/645 | 428/328 |
| 6,273,022 B1 * | 8/2001 | Pu | H01J 37/321 | 118/723 MR |
| 6,316,753 B2 * | 11/2001 | Clothier | H05B 6/06 | 219/622 |
| 6,369,370 B1 * | 4/2002 | Eskildsen | H05B 6/1254 | 219/621 |
| 6,488,820 B1 * | 12/2002 | Burkhart | H01L 21/6833 | 156/345.52 |
| 6,534,751 B2 * | 3/2003 | Uchiyama | H01L 21/67109 | 118/725 |
| 6,554,906 B1 * | 4/2003 | Kuibira | H01L 21/67103 | 156/345.52 |
| 6,740,853 B1 * | 5/2004 | Johnson | C23C 16/46 | 219/443.1 |
| 6,951,587 B1 * | 10/2005 | Narushima | C23C 16/4586 | 156/345.52 |
| 7,049,563 B2 * | 5/2006 | Keishima | H05B 6/1209 | 219/620 |
| 7,205,512 B2 * | 4/2007 | Takagi | H05B 6/145 | 219/676 |
| 7,323,668 B2 * | 1/2008 | Benitsch | H05B 6/101 | 219/649 |
| 7,508,646 B2 | 3/2009 | Emoto et al. | | |
| 7,848,075 B2 * | 12/2010 | Nobori | H01L 21/6831 | 361/234 |
| 8,129,664 B2 * | 3/2012 | Keishima | H01R 13/04 | 219/622 |
| 8,203,106 B2 * | 6/2012 | Kataoka | H05B 6/1209 | 219/622 |
| 8,890,041 B2 * | 11/2014 | Neumayer | H05B 6/1236 | 310/104 |
| 9,295,110 B2 | 3/2016 | Matsui et al. | | |
| 2001/0039161 A1 * | 11/2001 | Sato | H01J 9/027 | 445/40 |
| 2001/0042744 A1 * | 11/2001 | Tachikawa | H05B 3/68 | 219/544 |
| 2002/0002947 A1 * | 1/2002 | Satoyoshi | H01J 37/321 | 156/345.48 |
| 2002/0027130 A1 * | 3/2002 | Miyata | H05B 3/283 | 219/544 |
| 2002/0027762 A1 * | 3/2002 | Yamaguchi | G03F 7/707 | 279/128 |
| 2002/0043527 A1 * | 4/2002 | Ito | H01L 21/67103 | 219/385 |
| 2002/0150789 A1 * | 10/2002 | Hiramatsu | H01L 21/6833 | 428/688 |
| 2002/0158328 A1 * | 10/2002 | Hiramatsu | H01L 21/6833 | 257/700 |
| 2002/0162830 A1 * | 11/2002 | Taniguchi | H05B 3/48 | 219/541 |
| 2002/0180466 A1 * | 12/2002 | Hiramatsu | H01L 21/67103 | 219/209 |
| 2003/0010765 A1 * | 1/2003 | Hiramatsu | H05B 3/143 | 219/209 |
| 2003/0026060 A1 * | 2/2003 | Hiramatsu | H01L 21/67103 | 361/311 |
| 2003/0035088 A1 * | 2/2003 | Emoto | G03F 7/709 | 355/53 |
| 2003/0041971 A1 * | 3/2003 | Kido | H01L 21/68764 | 156/345.33 |
| 2003/0044653 A1 * | 3/2003 | Hiramatsu | H01L 21/6833 | 428/323 |
| 2003/0047802 A1 * | 3/2003 | Hiramatsu | H01L 23/49894 | 257/703 |
| 2003/0062631 A1 * | 4/2003 | Nemoto | H01L 24/78 | 257/784 |
| 2003/0064225 A1 * | 4/2003 | Ohashi | C30B 29/04 | 428/408 |
| 2003/0089699 A1 * | 5/2003 | Hiramatsu | H05B 3/143 | 219/468.1 |
| 2003/0089975 A1 * | 5/2003 | Hiramatsu | H01L 23/15 | 257/E23.009 |
| 2003/0098299 A1 * | 5/2003 | Hiramatsu | H05B 3/143 | 219/465.1 |
| 2003/0160042 A1 * | 8/2003 | Hiramatsu | H01L 21/67103 | 219/466.1 |
| 2003/0160626 A1 * | 8/2003 | Maruyama | G01R 31/2886 | 324/754.03 |

(56) References Cited

U.S. PATENT DOCUMENTS

| | | | |
|---|---|---|---|
| 2003/0164365 A1* | 9/2003 | Ito | H01L 21/67103 219/465.1 |
| 2003/0183616 A1* | 10/2003 | Goto | H05B 3/748 219/468.1 |
| 2004/0011287 A1* | 1/2004 | Ootsuka | C23C 16/4581 118/500 |
| 2004/0065881 A1* | 4/2004 | Ito | H05B 3/143 257/701 |
| 2004/0071945 A1* | 4/2004 | Ito | H01L 21/6831 428/209 |
| 2004/0074586 A1* | 4/2004 | Hiramatsu | C04B 35/6264 279/128 |
| 2004/0097359 A1* | 5/2004 | Hiramatsu | C04B 35/46 264/619 |
| 2004/0117977 A1* | 6/2004 | Hiramatsu | H01L 21/68757 257/524 |
| 2004/0177812 A1* | 9/2004 | Goto | C23C 16/4586 118/725 |
| 2004/0206747 A1* | 10/2004 | Ito | H01L 21/67103 219/541 |
| 2004/0245244 A1* | 12/2004 | Hirota | H05B 6/1254 219/624 |
| 2005/0008835 A1* | 1/2005 | Hiramatsu | H01L 21/67103 428/209 |
| 2005/0016685 A1* | 1/2005 | Emoto | H01L 21/6831 355/75 |
| 2005/0016986 A1* | 1/2005 | Ito | H05B 3/141 219/468.1 |
| 2005/0045618 A1* | 3/2005 | Ito | C04B 35/62655 219/548 |
| 2005/0056976 A1* | 3/2005 | Matsuda | H01L 21/67103 264/618 |
| 2005/0061796 A1* | 3/2005 | Higgins | H05B 3/748 219/460.1 |
| 2005/0115957 A1* | 6/2005 | Kataoka | H05B 6/062 219/620 |
| 2005/0173410 A1* | 8/2005 | Okajima | H05B 3/143 219/548 |
| 2005/0258142 A1* | 11/2005 | Cho | H01L 21/67103 219/50 |
| 2005/0258160 A1* | 11/2005 | Goto | H01L 21/67103 219/270 |
| 2006/0011611 A1* | 1/2006 | Goto | H01L 21/67103 219/444.1 |
| 2006/0174834 A1* | 8/2006 | Long | C23C 16/507 156/345.48 |
| 2006/0215338 A1* | 9/2006 | Yokouchi | H01L 21/6831 361/56 |
| 2008/0066676 A1* | 3/2008 | Mariner | H01L 21/68785 118/724 |
| 2008/0098833 A1* | 5/2008 | Sasaki | H01L 21/6831 73/865.9 |
| 2008/0170969 A1* | 7/2008 | Yoshioka | G05D 23/22 422/109 |
| 2008/0197780 A1* | 8/2008 | Yamazawa | H01L 21/67069 315/111.21 |
| 2009/0044752 A1* | 2/2009 | Furuya | H01J 37/32091 118/723 E |
| 2009/0047761 A1* | 2/2009 | Yamazaki | C23C 16/509 257/E29.291 |
| 2009/0078196 A1* | 3/2009 | Midorikawa | H01L 21/3065 118/75 |
| 2009/0133839 A1* | 5/2009 | Yamazawa | H01J 37/32724 156/345.48 |
| 2009/0137103 A1* | 5/2009 | Yamazaki | H01L 27/1214 438/479 |
| 2009/0159590 A1* | 6/2009 | Yonekura | H01L 21/67109 219/520 |
| 2009/0178764 A1* | 7/2009 | Kanno | H01L 21/67103 156/345.52 |
| 2009/0195110 A1* | 8/2009 | Miyake | H02K 15/022 310/216.058 |
| 2009/0218316 A1* | 9/2009 | Kouzuma | H01L 21/67248 216/67 |
| 2009/0293809 A1* | 12/2009 | Cho | H01L 21/68785 118/725 |
| 2009/0294412 A1* | 12/2009 | Kono | B23K 26/0734 219/129 |
| 2009/0314771 A1* | 12/2009 | Okada | H05B 6/062 219/647 |
| 2009/0321019 A1* | 12/2009 | Chen | H01J 37/32091 156/345.48 |
| 2010/0039747 A1* | 2/2010 | Sansoni | H01L 21/67103 361/234 |
| 2010/0055347 A1* | 3/2010 | Kato | H01J 37/32449 118/715 |
| 2010/0163188 A1* | 7/2010 | Tanaka | H01L 21/68742 156/345.52 |
| 2010/0243609 A1* | 9/2010 | Yamazawa | H01J 37/32697 156/345.44 |
| 2010/0275971 A1* | 11/2010 | Zingher | H02S 40/22 136/246 |
| 2011/0003048 A1* | 1/2011 | Sugimoto | A47J 27/086 99/468 |
| 2011/0073588 A1* | 3/2011 | Kusaka | H05B 6/062 219/621 |
| 2011/0092072 A1* | 4/2011 | Singh | C23C 14/50 156/345.52 |
| 2011/0094997 A1* | 4/2011 | Yamazawa | H01L 21/67069 216/68 |
| 2011/0126765 A1* | 6/2011 | Yamazawa | H01J 37/32091 118/723 MW |
| 2011/0147754 A1* | 6/2011 | Isa | H01L 29/78678 257/E21.414 |
| 2011/0266274 A1* | 11/2011 | Ebata | H05B 3/14 219/460.1 |
| 2011/0297650 A1* | 12/2011 | Tavassoli | H01L 21/6831 279/128 |
| 2012/0097661 A1* | 4/2012 | Singh | H05B 1/0233 219/446.1 |
| 2012/0285658 A1* | 11/2012 | Roy | H01L 21/68785 165/47 |
| 2013/0270250 A1* | 10/2013 | Pease | H05B 1/0233 219/443.1 |
| 2014/0014643 A1* | 1/2014 | Akiba | H01L 21/67103 219/444.1 |
| 2014/0014644 A1* | 1/2014 | Akiba | H01L 21/68785 219/444.1 |
| 2014/0048529 A1* | 2/2014 | Pease | H05B 1/0202 219/494 |
| 2014/0069585 A1* | 3/2014 | Aoto | H01J 37/32807 156/345.52 |
| 2014/0154819 A1* | 6/2014 | Gaff | H01L 22/14 156/345.52 |

FOREIGN PATENT DOCUMENTS

| | | |
|---|---|---|
| JP | 2003-300785 A | 10/2003 |
| JP | 2005-026296 A | 1/2005 |
| JP | 2007-250589 A | 9/2007 |
| JP | 2014-053481 A | 3/2014 |
| KR | 2000-0071410 A | 11/2000 |

\* cited by examiner

HEATER POWER FEEDING MECHANISM

CROSS-REFERENCE TO RELATED APPLICATIONS

The present application is a continuation of U.S. application Ser. No. 15/300,349, filed Sep. 29, 2016, which is based on PCT filing PCT/JP2015/063286, filed May 8, 2015, which claims priority to JP 2014-103511, filed May 19, 2014, the entire contents of each are incorporated herein by reference.

TECHNICAL FIELD

The present invention relates to a heater power feeding mechanism.

BACKGROUND ART

In a semiconductor production apparatus that performs fine-processing on a semiconductor wafer (which is hereafter referred to as a "wafer") by, for example, etching, the temperature of a stage on which the wafer is placed influences processing results such as an etching rate. For this reason, it is proposed to embed heaters in a stage and to control the temperature of the stage by heating the heaters (see, for example, Patent Document 1). In Patent Document 1, one heater power feeder is provided for each heater. Also, "multi-zone control" is proposed. In the multi-zone control, multiple heaters are embedded in a stage, the stage is divided into multiple zones corresponding to the heaters, and the temperatures of the zones of the stage are controlled independently. This configuration makes it possible to improve the in-plane uniformity of the temperature of a wafer on a stage.

RELATED-ART DOCUMENT

Patent Document

[Patent Document 1] Japanese Laid-Open Patent Publication No. 2005-026296

DISCLOSURE OF INVENTION

Problems to be Solved by the Invention

However, as the number of temperature-controllable zones increases, the number of heater power feeders in a heater power feeding mechanism proportionately increases, and the heater power feeding mechanism becomes complex. For example, to perform multi-zone control on a stage divided into 40 zones, at least 40 heater power feeders become necessary. As a result, the number of heater wires becomes very large, and the heater wires interfere with other components of a semiconductor production apparatus. This in turn causes a problem in assembling or maintaining the semiconductor production apparatus, and increases the workload of installing the semiconductor production apparatus.

In view of the above problem, an aspect of this disclosure provides a heater power feeding mechanism that is less likely to interfere with other components of a semiconductor production apparatus.

Means for Solving the Problems

To solve the above problem, an aspect of this disclosure provides a heater power feeding mechanism for independently controlling temperatures of zones of a stage on which a substrate is placed. The respective zones of the stage include heaters. The heater power feeding mechanism includes a plurality of heater terminals configured to be connected to the heaters, a plurality of heater wires connected to the heater terminals, and an offset structure that offsets the heater wires from each other. The heater terminals are disposed on the periphery of a holding plate for holding the stage.

Advantageous Effect of the Invention

An aspect of this disclosure makes it possible to provide a heater power feeding mechanism that is less likely to interfere with other components of a semiconductor production apparatus.

DESCRIPTION OF EMBODIMENTS

Embodiments of the present invention are described below with reference to the accompanying drawings. Throughout the specification and the drawings, the same reference number is assigned to substantially the same components, and repeated descriptions of those components are omitted.

<Overall Configuration of Semiconductor Production Apparatus>

Figure 1:
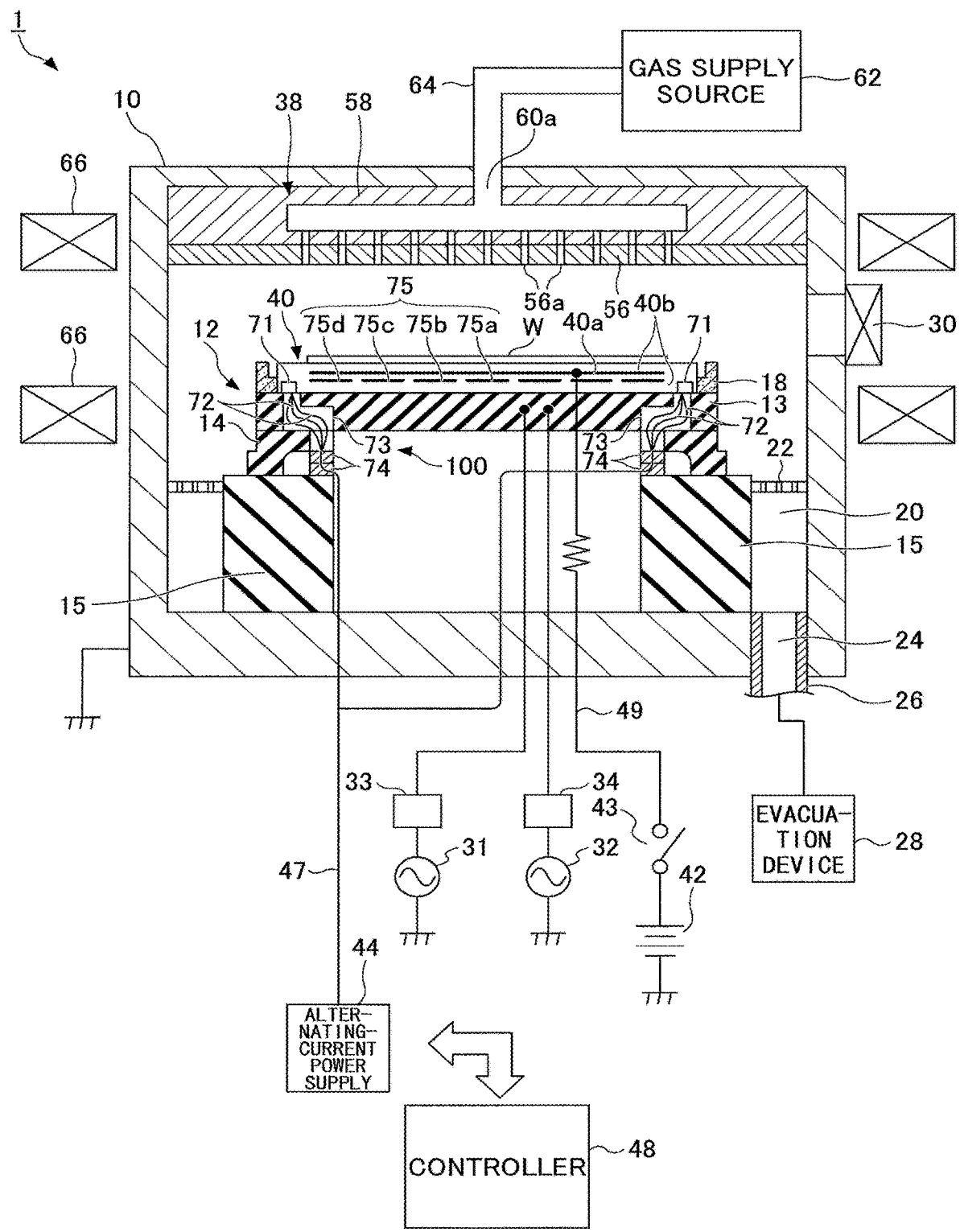
FIG. 1 is a longitudinal sectional view of a semiconductor production apparatus according to an embodiment.

First, an overall configuration of a semiconductor production apparatus 1 according to an embodiment of the present invention is described with reference to FIG. 1. FIG. 1 is a longitudinal sectional view of the semiconductor production apparatus 1 according to the embodiment of the present invention. In the present embodiment, a capacitively-coupled plasma etching apparatus is used as an example of the semiconductor production apparatus 1.

The semiconductor production apparatus 1 includes a cylindrical chamber 10 made of, for example, aluminum whose surface is alumite-treated (or anodized). The chamber 10 is grounded. A stage 12 is provided in the chamber 10. The stage 12 includes an electrostatic chuck (ESC) 40. The electrostatic chuck 40 is held by a holding plate 13.

The electrostatic chuck 40 includes an electrode 40a made of a conductive film, and insulating layers (or insulating sheets) 40b that sandwich the electrode 40a. A direct-current voltage source 42 supplies an electric current via a feeder line 49 to the electrode 40a under the control of a switch 43. With the electric current supplied from the direct-current voltage source 42, the electrostatic chuck 40 generates a Coulomb force to attract and hold a semiconductor wafer (which is hereafter referred to as a "wafer W").

Heaters 75a, 75b, 75c, and 75d (which may be collectively referred to as "heaters 75") are embedded in the electrostatic chuck 40. Instead of being embedded in the electrostatic chuck 40, the heaters 75 may be attached to the back surface of the electrostatic chuck 40. The heaters 75 are connected to a heater power feeding mechanism 100 and are connected via a feeder line 47 to an alternating-current power supply 44. An electric current output from the alternating-current power supply 44 is supplied via the feeder line 47 and the heater power feeding mechanism 100 to each of the heaters 75a, 75b, 75c, and 75d.

The heater power supply mechanism 100 enables multi-zone control where the stage 12 is divided into multiple zones using multiple heaters 75, and the temperatures of the zones of the stage 12 are controlled independently. A focus ring 18 made of, for example, silicon or quartz is provided around the electrostatic chuck 40 to improve the in-plane uniformity of etching.

A refrigerant pipe is formed in the stage 12. The temperatures of the zones of the electrostatic chuck 40 are independently controlled to adjust the temperature of the wafer W to a desired value by circulating a refrigerant supplied from a chiller unit through the refrigerant pipe and by heating the heaters 75.

The heater power feeding mechanism 100 includes multiple heater terminals 71, multiple heater wires 72, and an offset structure 73 for offsetting the heater wires 72 from each other. As described later, "offset" in the present embodiment indicates placing the heater wires 72 in desired positions by shifting the heater wires 72 from each other. The heater terminals 71 are connected to the heaters 75. The heater terminals 71 are disposed on the periphery of the holding plate 13 for holding the stage 12. The heater wires 72 are connected via the feeder line 47 to the alternating-current power supply 44.

In the present embodiment, the holding plate is made of an insulating material. However, the holding plate 13 may instead be made of a metal such as aluminum (Al), titanium (Ti), or silicon carbide (SiC). The holding plate 13 is supported by an insulating support 14 and a base plate 15. With this configuration, the stage 12 is fixed to the bottom of the chamber 10.

An evacuation pipe 26 forming an evacuation port 24 is provided at the bottom of the chamber 10, and the evacuation pipe 26 is connected to an evacuation device 28. The evacuation device 28 is implemented by a vacuum pump such as a turbo molecular pump or a dry pump. The evacuation device 28 reduces the pressure of a process space in the chamber 10 to a predetermined vacuum pressure, and discharges a gas in the chamber 10 via an evacuation channel 20 and the evacuation port 24. A baffle board 22 is placed in the evacuation channel 20 to control the flow of the gas.

A first high-frequency power supply 31 for exciting plasma is connected via a matching box 33 to the stage 12. Also, a second high-frequency power supply 32 for attracting ions to the wafer W is connected via a matching box 34 to the stage 12. The first high-frequency power supply 31 applies, to the stage 12, high-frequency power with a frequency of, for example, 60 MHz, which is suitable to generate plasma in the chamber 10. The second high-frequency power supply 32 applies, to the stage 12, high-frequency power with a frequency of, for example, 0.8 MHz, which is lower than the frequency of the high-frequency power output by the first high-frequency power supply 31 and is suitable to attract ions in the plasma to the wafer W on the stage 12. Thus, the stage 12 functions as a table on which the wafer W is placed as well as a lower electrode.

A shower head 38 is provided on the ceiling of the chamber 10. The shower head 38 functions as an upper electrode that is at a ground potential. With this configuration, the high-frequency power from the first high-frequency power supply 31 is applied to a "capacitor" formed between the stage 12 and the shower head 38.

The shower head 38 includes an electrode plate having multiple gas holes 56a, and an electrode support 58 that detachably supports the electrode plate 56. A gas supply source 62 supplies a gas via a gas supply pipe 64 and a gas inlet 60a into the shower head 38. The gas is introduced via the gas holes 56a into the chamber 10. Ring-shaped or concentric magnets 66 are disposed around the chamber 10 to control plasma generated in a plasma generation space between the upper electrode and the lower electrode with a magnetic force.

A controller 48 includes a CPU, a read-only memory (ROM), and a random access memory (RAM), and controls, for example, an etching process and the temperature of the electrostatic chuck 40 according to procedures defined by recipes stored in, for example, the RAM. Functions of the controller 48 may be implemented either by software or hardware.

When performing a process such as etching with the semiconductor production apparatus 1 with the above configuration, the wafer W held on a conveying arm is carried via an opened gate valve 30 into the chamber 10. The wafer W is held above the electrostatic chuck 40 by pusher pins and is placed on the electrostatic chuck 40 by lowering the pusher pins. After the wafer W is carried into the chamber 10, the gate valve 30 is closed. The pressure in the chamber 10 is reduced to a preset value by the evacuation device 28. An electric current is supplied from the direct-current voltage source 42 to the electrode 40a of the electrostatic chuck 40 to electrostatically attract the wafer W on the electrostatic chuck 40.

A gas is introduced in the form of a shower via the shower head 38 into the chamber 10. The introduced gas is ionized and dissociated by high-frequency power, and plasma is generated. With the plasma, plasma processing such as plasma etching is performed on the wafer W. After the plasma etching is completed, the wafer W is held on the conveying arm and carried out of the chamber 10. The above process is repeated to consecutively process multiple wafers W.

The overall configuration of the semiconductor production apparatus 1 of the present embodiment is described above. In the above embodiment, four heaters 75 are embedded in the electrostatic chuck 40. However, the heaters 75 may also be disposed in any other part of the stage 12. Also, the number of the heaters 75 may be any value greater than or equal to two.

However, as the number of the heaters 75 increases, the number of heater wires also increases, and the heater wires may interfere with other components of the semiconductor production apparatus 1. This in turn causes a problem in assembling or maintaining the semiconductor production apparatus 1, and increases the workload of installing the semiconductor production apparatus 1. In the present embodiment, the heater power feeding mechanism 100 is provided to prevent the heater wires 72 from interfering with other components of the semiconductor production apparatus 1, to prevent a problem in assembling or maintaining the semiconductor production apparatus 1, and to improve work efficiency even when the number of the heaters 75 is large.

Next, the heater power feeding mechanism 100 of the present embodiment is described with reference to FIGS. 2 and 3.

<Heater Power Feeding Mechanism>

Figure 2:
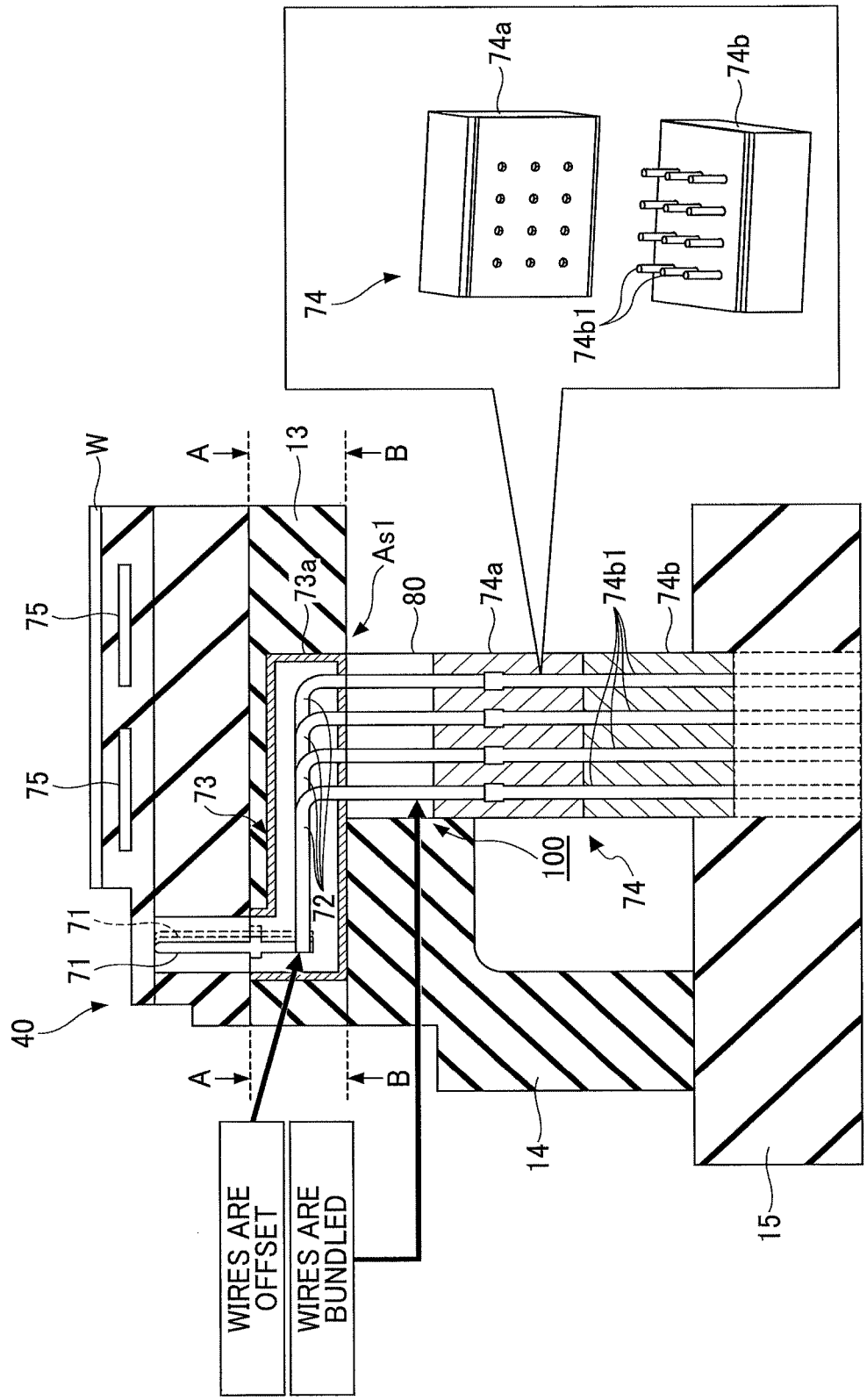
FIG. 2 is a longitudinal sectional view of an exemplary heater power feeding mechanism including a feeder assembly As1 according to an embodiment.

FIG. 2 is a longitudinal sectional view of the heater power feeding mechanism 100 of the present embodiment. In FIG. 3, "a" indicates an upper surface of the holding plate 13 and "b" indicates a lower surface of the holding plate 13 according to the present embodiment. Also in FIG. 3, "c" indicates a feeder assembly As1 and "d" indicates a feeder assembly As2 of the heater power feeding mechanism 100 of the present embodiment.

Figure 3:
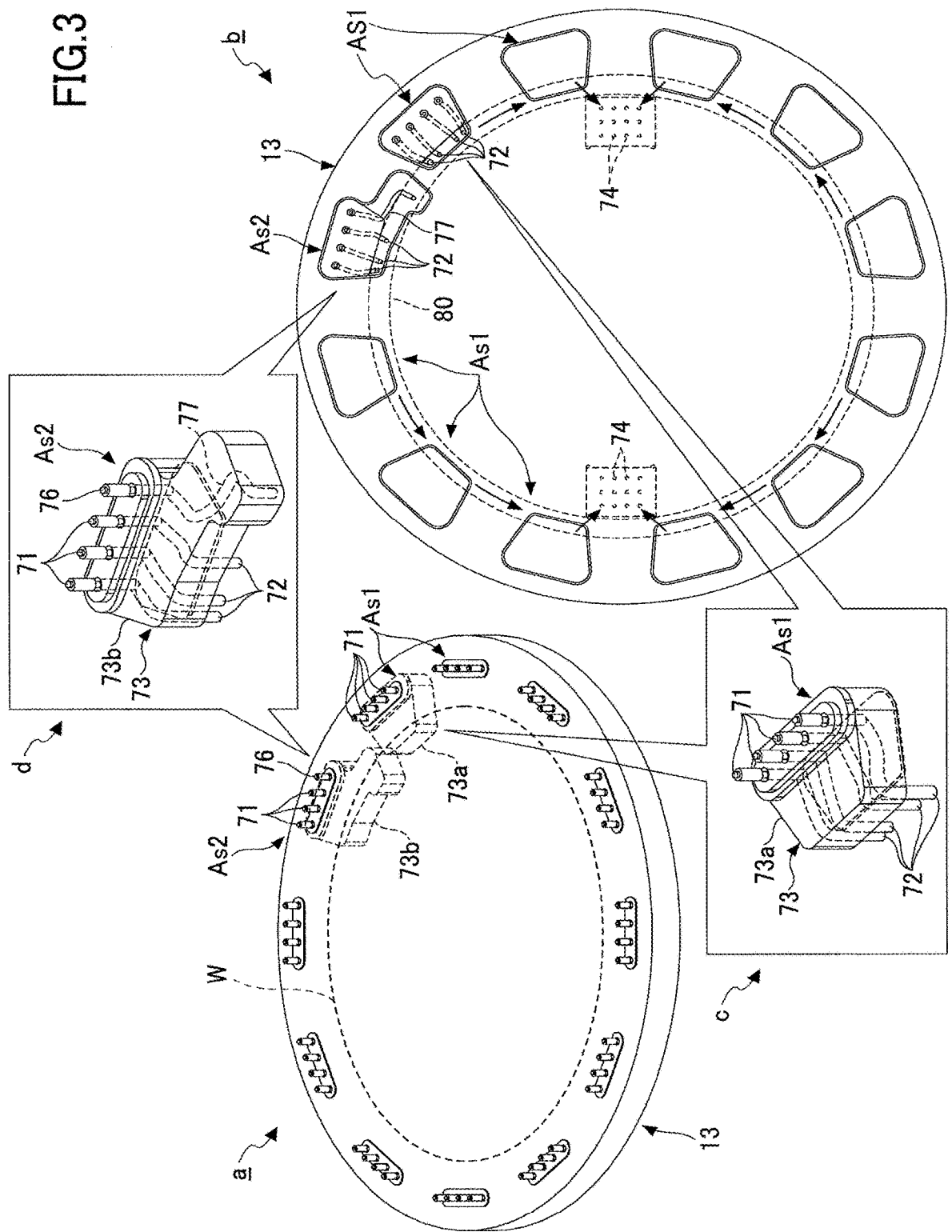
FIG. 3 is a drawing illustrating an upper surface of a holding plate indicated by "a", a lower surface of the holding plate indicated by "b", and feeder assemblies As1 and As2 of a heater power feeding mechanism indicated by "c" and "d" according to an embodiment.

As illustrated by FIGS. 2 and 3, the heater power feeding mechanism 100 includes multiple assemblies each of which includes multiple heater terminals 71, multiple heater wires 72 connected to the heater terminals 71, and an offset structure 73 for offsetting the heater wires 72 from each other. In FIG. 3, "a" indicates an upper surface of the holding plate 13 that corresponds to the A-A section of FIG. 2. Groups of terminals including a number of heater terminals 71 necessary for temperature control and an electrode terminal 76 are arranged on the periphery of the holding plate 13.

The periphery of the holding plate 13 on which the groups of terminals are arranged corresponds to an area of the stage 12 where the wafer W is not placed. With this configuration, the feeding points of the heaters 75 and the feeding point of the terminal of the electrostatic chuck 40 are located at positions that are closer to the outer edge of the electrostatic chuck 40 than the positions of the heater wires 72. Accordingly, in the present embodiment, feeder lines such as the heater wires 72 are located at positions offset from the positions of feeder terminals rather than at positions immediately below the feeder terminals. Thus, the heater terminals 71 and the electrode terminal 76 are disposed at positions that are closer to the outer edge of the electrostatic chuck 40 than an area of the electrostatic chuck 40 on which the wafer W is placed. This configuration makes it possible to prevent the Joule heat of the heater terminals 71 from influencing the wafer W, and to improve the in-plane uniformity of the temperature of the wafer W. That is, even when the number of the heater terminals 71 is increased for multi-zone temperature control of the electrostatic chuck 40, the above configuration makes it possible to maintain the in-plane uniformity of the temperature of the wafer W.

The offset structure 73 places the heater wires 72 in desired positions by shifting (or offsetting) the heater wires 72 from each other. The heater wires 72 are connected to a group of heater terminals 71. The offset heater wires 72 are bundled by a bundling part 80 (see FIG. 2 and "b" of FIG. 3) disposed below the holding plate 13. The bundling part is a resin case for bundling the heater wires 72 extending from the offset structure 73 and to be connected to a connector 74. The heater wires 72 bundled by the bundling part 80 are connected to the connector 74. The connector 74 is connected to the feeder line 47. An upper part 74a of the connector 74 is connected to the bundled heater wires 72. The upper part 74a and a lower part 74b of the connector 74 are joined together so that terminals 74b1 provided in the lower part 74b of the connector 74 are inserted into the upper part 74a of the connector 74. This configuration makes it possible to perform wire connection at the same time as the electrostatic chuck 40 is attached. One or more connectors 74 may be provided. The positions of the connectors 74 are not limited to those illustrated in FIG. 3 "b". The connectors 74 may be disposed at any positions near the bundling part 80.

<Feeder Assemblies As>

The heater power feeding mechanism 100 includes two types of feeder assemblies, i.e., the feeder assembly As1 of FIG. 3 "c" and the feeder assembly As2 of FIG. 3 "d" (which may be collectively referred to as "feeder assemblies As"). As illustrated by FIG. 3 "c", the feeder assembly As1 includes multiple heater terminals 71, multiple heater wires 72, and an offset structure 73. The heater terminals 71 are connected to the heater wires 72. The heater wires 72 are offset from each other in a case 73a. The case 73a may be made of, for example, a resin.

As illustrated in FIG. 2, in the offset structure 73 of the feeder assembly As1, the heater terminals 71 protrude from the upper surface of the case 73a. The heater wires 72 are shifted (or offset) from each other in the case 73a, and exit from desired positions in the bottom of the case 73a. The heater wires 72 are connected via the bundling part 80 and the connector 74 to the feeder line 47. With this configuration, an electric current from the alternating-current power supply 44 is supplied to the heaters 75 via the feeder line 47, the connector 74, the heater wires 72, and the heater terminals 71.

As illustrated by FIG. 3 "d", the feeder assembly As2 includes one electrode terminal 76, multiple heater terminals 71 other than the electrode terminal 76, one direct current wire 77, multiple heater wires 72 connected to the heater terminals 71, and an offset structure 73. The electrode terminal 76 is connected to the direct current wire 77. The wires 72 and 77 are offset from each other in a case 73b. The case 73b may be made of, for example, a resin.

Figure 4:
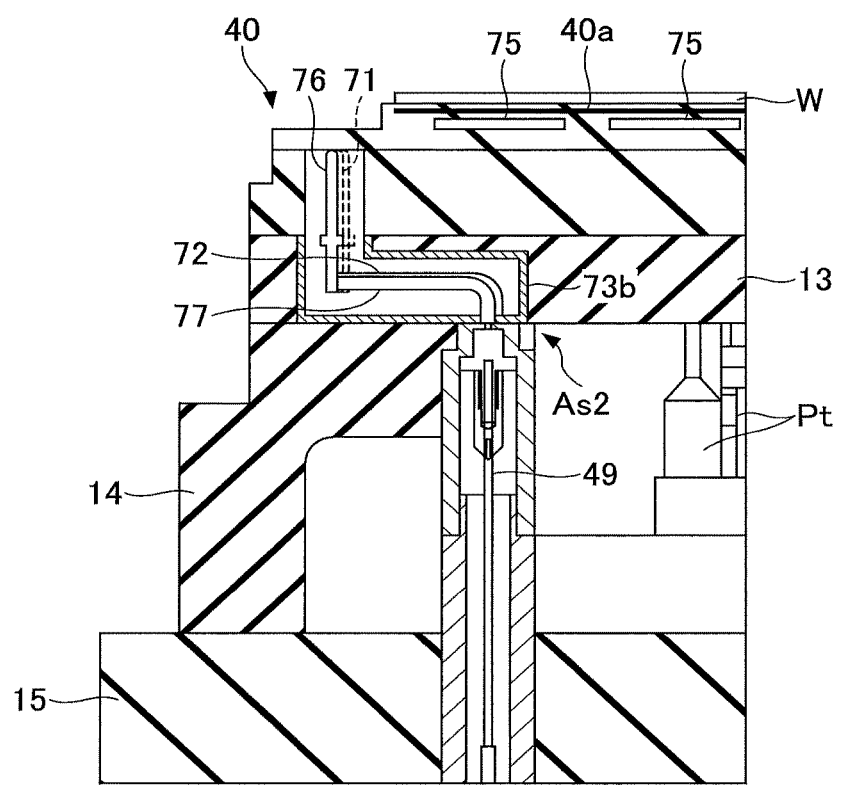
FIG. 4 is a longitudinal sectional view of an exemplary heater power feeding mechanism including a feeder assembly As2 according to an embodiment.

As illustrated in FIG. 4, in the offset structure 73 of the feeder assembly As2, the electrode terminal 76 and the heater terminals 71 other than the electrode terminal 76 protrude from the upper surface of the case 73b. The direct current wire 77 and the heater wires 72 are shifted (or offset) from each other in the case 73b, and exit from desired positions in the bottom of the case 73b. The direct current wire 77 is connected via the bundling part 80 to the feeder line 49. With this configuration, an electric current from the direct-current voltage source 42 is supplied to the electrode terminal 76 via the feeder line 49 and the direct current wire 77. The heater wires 72 are connected via the bundling part 80 and the connector 74 to the feeder line 47.

In FIG. 3, "b" indicates a lower surface of the holding plate 13 that corresponds to the B-B section of FIG. 2. In the present embodiment, eleven feeder assemblies As1 and one feeder assembly As2, which are preassembled, are fixed in the holding plate 13 by, for example, welding. Thus, the feeder assemblies As1 and As2 are placed at predetermined positions in the holding plate 13. The heater wires 72 connected to a number of heater terminals 71 necessary for temperature control and the direct current wire 77 connected to the electrode terminal 76 exit from the cases of eleven feeder assemblies As1 and one feeder assembly As2, and are bundled by the bundling part 80 below the holding plate 13. The bundling part 80 has a substantially-annular shape, bundles the wires in a resin case, and guides the wires to the connectors 74 to which the wires are connected.

For example, as illustrated in FIGS. 2 and 4, a space is formed between the holding plate 13 and the base plate 15. This space houses components (indicated by "Pt" in FIG. 4) such as a thermometer and pusher pins for raising and lowering the wafer W when the wafer W is carried into and out of the chamber 10.

When the electrostatic chuck 40 is divided into many zones whose temperatures are independently controlled, heaters need to be provided for the respective zones and hence the number of heater wires 72 greatly increases. When the number of heater wires 72 becomes large, the heater wires 72 interfere with other components Pt in the semiconductor production apparatus 1. This in turn causes a problem in assembling or maintaining the semiconductor production apparatus 1, and increases the workload of installing the semiconductor production apparatus 1.

In the heater power feeding mechanism 100 of the present embodiment, the heater wires 72 and the direct current wire 77 in each of the feeder assemblies As1 and As2 are offset from each other. Also, the offset heater wires 72 and direct current wire 77 are bundled by the bundling part 80 and connected to the connector 74.

This configuration reduces the interference of the heater wires 72 and the direct current wire 77 with other components Pt, and makes it possible to prevent a problem in assembling or maintaining the semiconductor production apparatus 1.

Also according to the present embodiment, preassembled feeder assemblies As1 and As2 can be attached to predetermined positions in the holding plate 13 from underneath the holding plate 13. This makes it possible to reduce the time necessary to assemble the heater power feeding mechanism 100 and to easily and quickly connect the heater wires 72 and the direct current wire 77 to the feeder lines. This also makes it possible to improve the efficiency of assembling and maintaining the heater power feeding mechanism 100.

Also in the present embodiment, the heater terminals 71 and the electrode terminal 76 are disposed at positions that are closer to the outer edge of the electrostatic chuck 40 than an area of the electrostatic chuck 40 on which the wafer W is placed. This configuration makes it possible to prevent the Joule heat of the heater terminals 71 from influencing the wafer W, and to improve the in-plane uniformity of the temperature of the wafer W. That is, even when the number of the heater terminals 71 is increased for multi-zone temperature control of the electrostatic chuck 40, the above configuration makes it possible to maintain the in-plane uniformity of the temperature of the wafer W.

A heater power feeding mechanism according to the embodiment is described above. However, the present invention is not limited to the specifically disclosed embodiment, and variations and modifications may be made without departing from the scope of the present invention. Also, embodiments may be combined in any appropriate manner.

The heater feeding mechanism 100 of the above embodiment is configured to control the temperatures of respective zones of the electrostatic chuck 40 each of which includes a heater. However, the heater power feeding mechanism of the present invention is not limited to the above embodiment. For example, multiple heaters may be embedded in a component (e.g., the holding plate 13) other than the electrostatic chuck 40 to divide the holding plate 13 into multiple zones corresponding to the heaters, and the heater power feeding mechanism may be configured to enable multi-zone control of the temperature of the holding plate 13.

Also in the above embodiment, each of the feeder assemblies As1 and As2 of the heater power feeding mechanism 100 includes multiple heater terminals 71, multiple heater wires 72, and an offset structure 73 for offsetting the heater wires 72 from each other. The number of two types of feeder assemblies and the number of components constituting each feeder assembly are not limited to those described in the above embodiment.

Also, the heater power feeding mechanism of the present invention may be applied not only to a capacitively-coupled plasma (CCP) apparatus but also to other types of semiconductor production apparatuses. Examples of other types of semiconductor production apparatuses may include an inductively-coupled plasma (ICP) apparatus, a chemical vapor deposition (CVD) apparatus using a radial line slot antenna, a helicon wave plasma (HWP) apparatus, and an electron cyclotron resonance (ECR) plasma apparatus.

Further, the heater power feeding mechanism of the present invention may be applied not only to a semiconductor production apparatus for processing a wafer, but also to a semiconductor production apparatus for processing a large-size substrate for a flat panel display, an EL element, or a substrate for a solar battery.

The present international application claims priority from Japanese Patent Application No. 2014-103511 filed on May 19, 2014, the entire contents of which are hereby incorporated herein by reference.

EXPLANATION OF REFERENCE NUMERALS

1: Semiconductor production apparatus
10: Chamber
12: Stage (lower electrode)
13: Holding plate
28: Evacuation device
38: Shower head (upper electrode)
40: Electrostatic chuck
44: Alternating-current power supply
42: Direct-current voltage source
47, 49: Feeder line
71: Heater terminal
72: Heater wire
73: Offset structure
73a: Case
73b: Case
74: Connector
76: Electrode terminal
77: Direct current wire
80: Bundling part
100: Heater power feeding mechanism
As1, As2: Feeder assembly

The invention claimed is:

1. A plasma processing apparatus, comprising:
a plasma processing chamber;
a base plate disposed in the plasma processing chamber;
an insulating support disposed on the base plate;
a holding plate disposed on the insulating support;
an electrostatic chuck disposed on the holding plate, the electrostatic chuck having an upper face onto which a substrate is placed;
multiple heaters disposed inside the electrostatic chuck;
multiple heater terminals downwardly disposed inside a peripheral region of the holding plate and electrically connected to the respective multiple heaters;
multiple heater wires extending inside the holding plate and electrically connected to the bottom end of the respective multiple heater terminals; and
first cases disposed so as to surround the multiple heater wires inside the holding plate, wherein
the multiple heater terminals are electrically connected to the respective multiple heaters in a peripheral region of the electrostatic chuck, and
the multiple heater wires extend from bottom ends of the respective multiple heater terminals toward a center of the holding plate.

2. The plasma processing apparatus of claim 1, wherein the insulating support comprises:
an internal bundling part that bundles the heater wires;

an upper connector disposed under the bundling part; and
a lower connector connected to the upper connector.

3. The plasma processing apparatus of claim 2, wherein the multiple heater terminals consist of plural terminal groups every predetermined number of terminals, the plural terminal groups being separately disposed circumferentially along the peripheral region of the holding plate, and multiple heater wires connected to each terminal group being surrounded by each of the first cases.

4. The plasma processing apparatus of claim 3, wherein the plural terminal groups are circumferentially disposed at equal distances.

5. The plasma processing apparatus of claim 1, wherein the holding plate comprises:
   an electrode terminal disposed on a peripheral region of the holding plate, the electrode terminal being for electrostatically clamping the substrate;
   a DC wire electrically connected to the bottom end of the electrode terminal inside the holding plate; and
   a second case disposed so as to surround the multiple heater wires and the DC wire inside the holding plate, and
the electrostatic chuck comprises an internal electrode,
the electrode terminal is electrically connected to the internal electrode disposed inside the electrostatic chuck, and
the multiple heater wires extend from the bottom ends of the respective heater terminals toward the center of the holding plate and the DC wire extends from the bottom end of the electrode terminal, inside the holding plate.

6. The plasma processing apparatus of claim 5, wherein the insulating support comprises:
   an internal bundling part that bundles the heater wires and the DC wires;
   an upper connector disposed under the bundling part; and
   a lower connector connected to the upper connector.

7. The plasma processing apparatus of claim 6, wherein the multiple heater terminals consist of plural terminal groups every predetermined number of terminals, the plural terminal groups being separately disposed circumferentially along the peripheral region of the holding plate, and multiple heater wires connected to each terminal group being surrounded by each of the first case or the second case.

8. The plasma processing apparatus of claim wherein the electrode terminal belongs to any one of the plural terminal groups.

9. The plasma processing apparatus of claim 7, wherein the plural terminal groups are circumferentially disposed at equal distances.

10. The plasma processing apparatus of claim 5, wherein the multiple heater terminals consist of plural terminal groups every predetermined number of terminals, the plural terminal groups being separately disposed circumferentially along the peripheral region of the holding plate, and multiple heater wires connected to each terminal group being surrounded by each of the first cases or the second case.

11. The plasma processing apparatus of claim 10, wherein the electrode terminal belongs to any one of the plural terminal groups.

12. The plasma processing apparatus of claim 10, wherein the plural terminal groups are circumferentially disposed at equal distances.

13. The plasma processing apparatus of claim 1, wherein the multiple heater terminals consist of plural terminal groups every predetermined number of terminals, the plural terminal groups being separately disposed circumferentially along the peripheral region of the holding plate, and multiple heater wires connected to each terminal group being surrounded by each of the first cases.

14. The plasma processing apparatus of claim 13, wherein the plural terminal groups are circumferentially disposed at equal distances.

15. The plasma processing apparatus of claim 1, wherein
   a top surface of the holding plate is parallel to a first plane, and
   the multiple heater wires extend, from the bottom ends of the respective multiple heater terminals toward the center of the holding plate, in a first direction parallel to the first plane.

16. The plasma processing apparatus of claim 15, wherein
   a first portion of the multiple heater wires extends in the first direction, and
   a second portion of the multiple heater wires extends in a second direction that is normal to the first plane toward the insulating support.

* * * * *